(12) United States Patent
Chao et al.

(10) Patent No.: US 11,137,419 B2
(45) Date of Patent: Oct. 5, 2021

(54) MUTIPLE RANGE CURRENT SENSOR TECHNIQUES

(71) Applicant: Analog Devices International Unlimited Company, Limerick (IE)

(72) Inventors: Hio Leong Chao, Tempe, AZ (US); Hai Chen, Gilbert, AZ (US); Syed Mk Bari, Tempe, AZ (US)

(73) Assignee: Analog Devices International Unlimited Company, Limerick (IE)

( * ) Notice: Subject to any disclaimer, the term of this patent is extended or adjusted under 35 U.S.C. 154(b) by 19 days.

(21) Appl. No.: 16/717,699

(22) Filed: Dec. 17, 2019

(65) Prior Publication Data

US 2021/0181238 A1  Jun. 17, 2021

(51) Int. Cl.
*G01R 1/20* (2006.01)
*G01R 15/09* (2006.01)
*G01R 19/00* (2006.01)

(52) U.S. Cl.
CPC ............. *G01R 1/203* (2013.01); *G01R 15/09* (2013.01); *G01R 19/0092* (2013.01)

(58) Field of Classification Search
None
See application file for complete search history.

(56) References Cited

U.S. PATENT DOCUMENTS

| 4,937,697 A | 6/1990 | Edwards et al. |
| 5,347,419 A | 9/1994 | Caron et al. |
| 5,498,984 A | 3/1996 | Schaffer |
| 5,920,189 A * | 7/1999 | Fisher .................... G01R 15/09 324/115 |
| 6,977,489 B2 | 12/2005 | Isham |
| 7,031,855 B2 | 4/2006 | Mottola |
| 7,215,999 B1 * | 5/2007 | Shahandeh .......... A61N 1/3708 607/29 |
| 7,683,604 B1 | 3/2010 | Steele et al. |

(Continued)

FOREIGN PATENT DOCUMENTS

| CN | 107528487 A | 12/2017 |
| EP | 0397102 A2 | 11/1990 |

(Continued)

OTHER PUBLICATIONS

"LT6118: Current Sense Amplifier, Reference and Comparator with POR", Linear Technology Corp., (2014), 24 pgs.

(Continued)

*Primary Examiner* — Jas A Sanghera
(74) *Attorney, Agent, or Firm* — Schwegman Lundberg & Woessner, P.A.

(57) ABSTRACT

Techniques for improved multiple-range current sensing are provided. In an example, a circuit can include a plurality of shunt resistors, a plurality of gain resistors, and a first switch. A first shunt resistor of the plurality of shunt resistors can be of a different type that the other shunt resistors of the plurality of shunt resistors. The plurality of gain resistors can include a first gain resistor of the same resistor type as the first shunt resistor. The first gain resistor can be a different resistor type than the other gain resistors of the plurality of gain resistors. The switch can be configured to couple the first shunt resistor with the load in a first state and to isolate the first shunt resistor from the load in a second state.

20 Claims, 9 Drawing Sheets

(56) References Cited

U.S. PATENT DOCUMENTS

| | | |
|---|---|---|
| 7,936,540 B2 | 5/2011 | Isham |
| 8,324,721 B2 | 12/2012 | Udompanyavit et al. |
| 8,436,681 B2 | 5/2013 | Ho et al. |
| 9,304,152 B2 | 4/2016 | Aerts |
| 9,407,145 B1 | 8/2016 | Burstein et al. |
| 9,671,437 B2 | 6/2017 | Akahane |
| 9,673,192 B1 | 6/2017 | Lopata et al. |
| 9,709,603 B2 | 7/2017 | Ferguson |
| 10,312,800 B2 | 6/2019 | Yamada |
| 2010/0079132 A1* | 4/2010 | Steele .............. G01R 1/30 324/123 R |
| 2011/0089931 A1 | 4/2011 | Podlisk et al. |
| 2011/0095818 A1 | 4/2011 | Sullivan |
| 2015/0260760 A1* | 9/2015 | Katakura ............ G01R 1/203 324/715 |
| 2016/0173045 A1 | 6/2016 | Creosteanu et al. |
| 2017/0089955 A1 | 3/2017 | Yugou et al. |
| 2017/0253029 A1 | 9/2017 | Inoue |
| 2019/0050009 A1 | 2/2019 | Price et al. |
| 2019/0257865 A1 | 8/2019 | Mcphalen |
| 2021/0048453 A1 | 2/2021 | Chao |

FOREIGN PATENT DOCUMENTS

| | | |
|---|---|---|
| EP | 2388599 A2 | 11/2011 |
| JP | 4888714 B2 | 12/2011 |
| JP | 5096020 B2 | 9/2012 |

OTHER PUBLICATIONS

"Sensing Elements for Current Measurements", Renesas Electronics America Inc (REA), (2018), 17 pgs.

"Simplifying Current Sensing: How to design with current sense aplifiers", Texas Instruments Inc., (2018), 53 pgs.

Huang, Wenkang, et al., "Inductors Allow Loss-Less Current Sensing in Multiphase DC-DC Converters", PCIM, 27(6), (Jun. 2001), 58-67.

Johnson, Matthew Robert, "Fast, Accurate Power Measurement and Optimization for Microprocessor Platforms", Ph.D. Dissertation in Electrical and Computer Engineering, University of Illinois at Urbana-Champaign, (2015), 81 pgs.

Munoz, Diego Ramirez, et al., "Constant Current Drive for Resistive Sensors Based on Generalized Impedance Converter", IEEE Transactions on Instrumentation and Measurement, 57(10), (Oct. 2008), 2290-2296.

Yiu, Chun-Chee Francis, "Gain-Reconfigurable Current-Sensing Circuit for High-Frequency Low-Power dc-dc Converters", Masters Thesis in Electrical and Computer Engineering at the University of Toronto, (2010), 95 pgs.

"U.S. Appl. No. 16/539,404 Preliminary Amendment filed Jul. 17, 2020", 4 Pgs.

"U.S. Appl. No. 16/539,404, Non Final Office Action dated Apr. 20, 2021", 15 pgs.

\* cited by examiner

MUTIPLE RANGE CURRENT SENSOR TECHNIQUES

TECHNICAL FIELD OF THE DISCLOSURE

The present disclosure is related to current sensing circuits and more particularly to techniques for multiple-range current sensing.

BACKGROUND

Current monitoring circuits can be used to monitor and report the load current information of a system. A conventional way to sense the current is to use a shunt resistor in series with the path of current flow and measure the voltage developed across the shunt resistor. Due to Ohm's law, the voltage across the shunt resistor terminals is proportional to the current though the resistor. A current sensor circuit works together with the shunt resistor to produce an output signal that is proportional to the current through the shunt resistor. A source of error for a current sensor circuit is offset error caused by finite open-loop gain or device mismatch.

The offset error has the most impact to the current monitor output accuracy when the input signal is small. When the input signal is large relative to the offset error, the output accuracy improves because the signal it is measuring is larger than the offset error in the current monitor itself. However, larger signals generally decrease the efficiency of the system while smaller signals challenge the accuracy. In some systems, it is required to report the load current information with high accuracy over a span of multiple decades.

SUMMARY OF THE DISCLOSURE

Techniques for improved multiple-range current sensing are provided. In an example, a circuit can include a plurality of shunt resistors, a plurality of gain resistors, and a first switch. A first shunt resistor of the plurality of shunt resistors can be of a different type and resistance that the other shunt resistors of the plurality of shunt resistors. The plurality of gain resistors can include a first gain resistor of the same resistor type as the first shunt resistor. The first gain resistor can be a different resistor type and resistance than the other gain resistors of the plurality of gain resistors. The switch can be configured to couple the first shunt resistor with the load in a first state and to isolate the first shunt resistor from the load in a second state.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A multi-ranging current monitor circuit can sense a current over a wide range with good accuracy. A multi-ranging current monitor circuit can use multiple shunt resistors of various values for current monitoring and for providing a scaled representation of current level of a uni-directional or bi-directional load current supplied by one or more power supplies. Depending on the level of the current, the appropriate shunt resistor can be selected to conduct the current. Selecting the appropriate shunt resistor according to the magnitude of the sense current can allow the input signal to the current monitor to be always within a reasonable range; thus, minimizing the effect of offset error on the output accuracy of a current monitor while using a small shunt resistor to minimize efficiency degradation.

A shunt resistor with low temperature coefficient (TC) is typically used for current monitors where the output accuracy depends on the absolute resistance of the shunt resistor. For conventional multi-ranging current monitor circuits, that can mean multiple low TC shunt resistors are required. The cost of discrete low TC shunt resistors is generally high relative to the system cost. This is especially true for conventional multi-ranging current monitor circuits where many multiple shunt resistors are used.

The present inventors have recognized techniques for a multi-ranging current monitor architecture that can help to eliminate or reduce the number of discrete low TC shunt resistors by using shunt resistors and gain resistors made from different materials. By using shunt and gain resistors made from the same material, the output accuracy of the current monitor can be made independent of the absolute resistance of the shunt resistor. Furthermore, in certain examples, the multi-ranging current monitor architecture can utilize shunt resistors of different materials for sensing current in different ranges. For example, for low sense current, for example, the shunt and gain resistors can be realized using thin-film material; for intermediate sense current, the shunt and gain resistors can be realized using metallization resistor; for high sense current, the shunt and gain resistors can be realized using Bismaleimide-Triazine resin (BT)-substrate; for ultra-high sense current, the shunt and gain resistors can be realized using the copper on PCB or by using discrete low TC resistors. In certain examples, a metal shunt resistor with a BT substrate can be employed to sense current of around 100 Amperes. Such a shunt resistor can include copper conduction medium and can be fabricated to have a footprint of about 20.00 millimetres (mm) by 25.97 mm.

Figure 1:
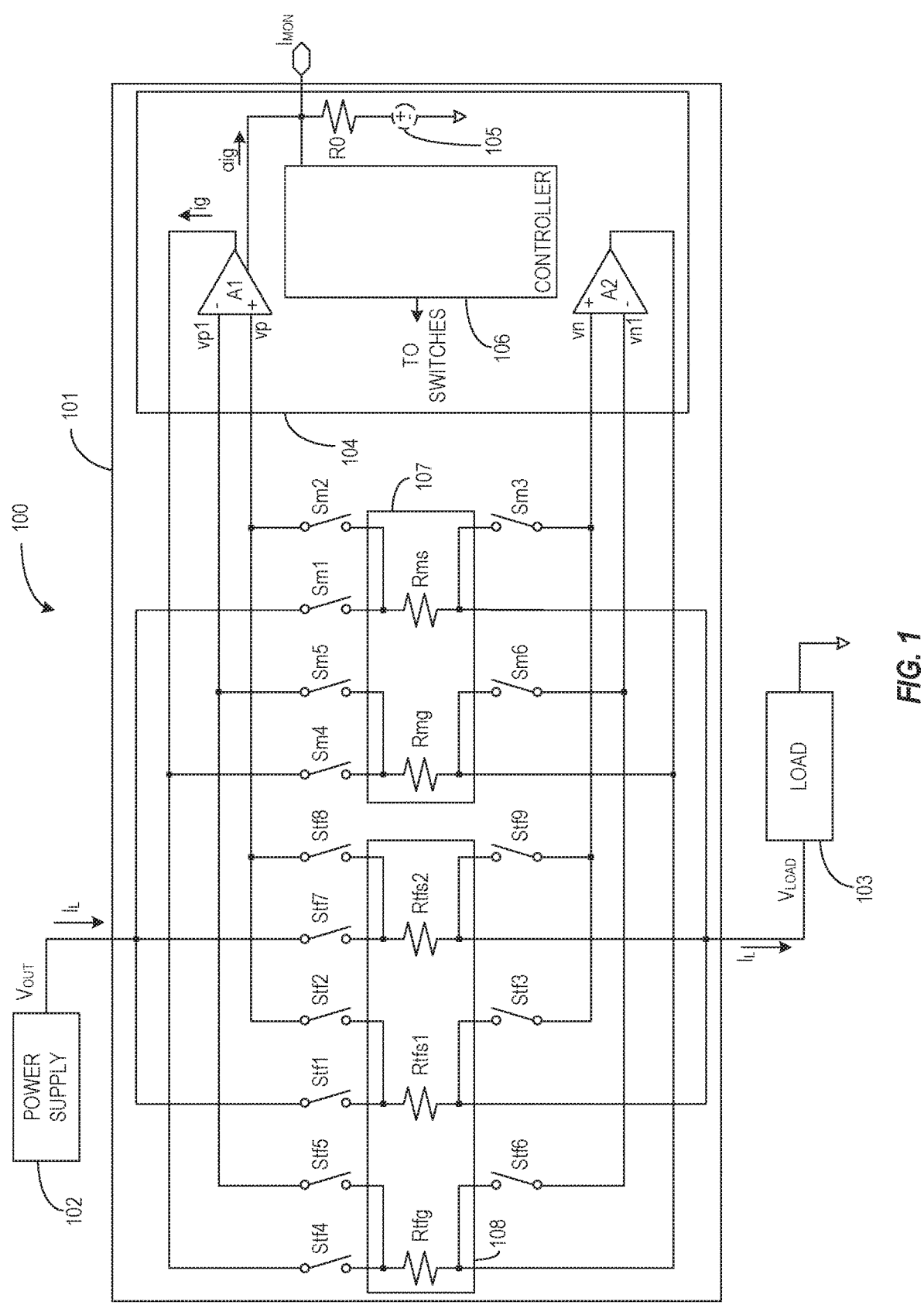
FIG. 1 illustrates generally a system including an example current sensor circuit.

FIG. 1 illustrates generally a system 100 including an example current sensor circuit 101. The system 100 can include a power supply, the current sensor circuit 101 and a load 102. In some examples, the power supply 102 can include a voltage regulator. The current sense circuit 101 can monitor the current ($I_L$) supplied to the load 103 from the power supply 102 and can provide a scaled representation (IMN) of the supplied current as an output. In some examples, the output of the current sense circuit 101 can be used as feedback for the power supply 102 but is not limited as such.

The current sensor circuit 101 can include a plurality of shunt resistors, a plurality of gain resistors (Rmg, Rtfg), a plurality of switches (Stf1-Stf9, Sm1-Sm6), and conversion circuitry 104 to provide the representation ($I_{MON}$) of the sensed current ($I_L$). In certain examples, the current sensor circuit 101 can employ thin-film (tf) and metal-on-silicon (m) as the shunt resistors. In certain examples, the conversion circuitry 104 can include a pair of amplifiers (A1, and A2), an optional output resistor (R0), an optional voltage reference 105, and a controller 106. The controller 106 can monitor the scaled representation (IMON) at the output of the current sense circuit 101 and can control the switches (Stf1-Stf9, Sm1-Sm6) to accommodate, in most cases, the best sensing range for the level of current sensed.

During operation, one of the shunt resistors (Rms, Rtfs1, and Rtfs2) and one of the gain resistors (Rmg, and Rtfg) can be selected and used by the current sensor circuit 101. The gain and shunt resistors that are utilized by the current sensor circuit 101 are herein referred to as the selected gain and shunt resistors. The selected gain and shunt resistors are of the same resistor type. In certain examples, the selected gain and shunt resistors can be located adjacent each other so that the selected gain and shunt resistors shared the same operating temperature. In certain examples, an integrated circuit can include the selected gain and shunt resistors and the selected gain and shunt resistors can be interdigitated with each other so that the selected gain and shunt resistors shared the same operating temperature. A resistor type is defined by resistor made from a particular type of material or having a specific TC characteristic. For example, a thin-film resistor is a resistor type, metal resistor is another resistor type, and low TC discrete shunt resistor is a resistor type. The illustrated example of FIG. 1 includes a metal resistor module 107 including a metal shunt resistors (Rms) and a metal gain resistor (Rmg). The illustrated example of FIG. 1 also includes a thin-film resistor module 108 including a multiple thin-film shunt resistors (Rtfs1, Rtfs2) and a thin-film gain resistor (Rtfg). Types of resistors that may be used include, but are not limited to, diffusion resistors, ploy resistors, thin-film resistors, metal resistors or matched low-TC resistors. In some examples, the resistors can be integrated on a semiconductor substrate, a Bismaleimide-Triazine resin (BT) substrate, or a printed circuit board (PCB) substrate.

During operation, an output ($V_{OUT}$) of the power supply 102 can supply power to an input node ($V_{LOAD}$) of the load 103 via the current sense circuit 101. A first group of switches (Stf1, Stf7, Sm1) can operate to couple a selected shunt resistor in series between the power supply 102 and the load 103. A second group of switches (Stf2, Stf3, Stf8, Stf9, Sm2, Sm3) can operate to couple each node of the selected shunt resistor to an input of each amplifier (A1, A2). A third group of switches (Stf5, Sm5) can operate to connect a selected gain resistor with a feedback network of the first amplifier (A1). A fourth group of switches (Stf6, Sm6) can serve as kelvin connections to the selected gain resistor and do not conduct d current during operation.

The illustrated current sensor circuit 101 has three different sense ranges but the present subject matter is not limited as such. When the current sensor circuit 101 is operating at the lowest sense range, thin-film resistors Rtfs2 and Rtfg can be used as the selected shunt and gain resistors. In certain examples, the lowest sense range can correspond to the highest resolution range. When the current sensor circuit 101 is operating at the intermediate sense range, thin-film resistors Rtfs1 and Rtfg can be used as the selected shunt and gain resistors. When the current sensor circuit is operating at the highest sense range, metal resistors Rms and Rmg can be used as the selected shunt and gain resistors. In certain examples, the highest sense range can correspond to the lowest resolution range. Resistors Rtfs1, Rtfs2, and Rtfg are made from thin-film material which has very low TC characteristic, and Rtfg should track Rtfs1 and Rtfs2 in temperature to minimize temperature drift.

The following example describes the operation of the current sensor circuit 101 and assumes the current sense circuit 101 is operating at the highest sense range. As such, switches Sm1 to Sm6 are closed. The power supply 102 can provide power to the load 103 via a load current ($I_L$) at the voltage provided by the power supply 102. The load current ($I_L$) can pass to the load 102 via the selected shunt resistor Rms and switch Sm1, and can develop a sense voltage (Vs) across the selected shunt resistor (Rms). The sense voltage (Vs) can be given by:

$$Vs = vp - vn = iL \cdot Rms. \quad (Eq.\ 1)$$

When the amplifiers (A1 and A2) are in equilibrium, the node voltage "vp" and "vn" are mirrored to nodes "vp1" and "vn1". A current (ig) is provided by the first amplifier (A1) to the selected gain resistor (Rmg) through switch Sm4, and the current (ig) flows from Rmg to the second amplifier (A2). The current through Rmg can be given by:

$$ig = (vp1 - vn1)/Rmg = (vp - vn)/Rmg = I_L \cdot Rms/Rmg. \quad (Eq.2)$$

The second output terminal of the first amplifier (A1), or a third amplifier (α), can source a current, α·ig, into an output resistor (R0). In certain examples, the second output or the third amplifier (α) can be implemented via a current-dependent amplifier or current source such as a ratioed current mirror for example. The scaled representation ($I_{MON}$) of the load current (IL) can be given by:

$$I_{MON} = \alpha \cdot ig \cdot R0 + Vref. \quad (Eq.\ 3)$$

By substituting Eq. 2 for "ig" into Eq. 3, the $I_{MON}$ voltage can be expressed as follow:

$$I_{MON} = I_L \cdot \alpha \cdot R0 \cdot Rms/Rmg + Vref. \quad (Eq.\ 4)$$

Eq. 4 shows that the quality of the scaled representation ($I_{MON}$) relies on α, Vref, Ro, and the ratio between the selected gain and the shunt resistors (e.g., Rms, Rmg). In this example, the selected shunt resistor (Rms) can conduct the load current ($I_L$) and can be a metal resistor. The conductive material for metal resistor on silicon processes are typically Aluminum, which has a TC of 0.36%/° C. Accuracy of the current measurement relies on the consistency of the ratio of the selected shunt and gain resistors (e.g., Rms/Rmg) over the operating temperature. As such, the selected gain resistor can have the same or nearly the same TC as the selected shunt resistor when the selected gain resistor (Rmg) are of the same construction and share the operation temperature of Rms. Example construction techniques of the gain and shunt resistor using metal layers to optimized temperature sharing is discussed in detail in U.S. patent application Ser. No. 16/539,404, titled, SHUNT RESISTOR AVERAGING TECHNIQUES, filed Aug. 13, 2019, and which is hereby incorporated by reference herein in its entirety. Metal resistors can have relatively low sheet rho and can be more suitable to conduct current that is too large in terms of silicon area to handle by the thin-film material. Metal resistor-type shunt resistors can be fabricated in the range of values between tens of ohms down to a few milliohms (mΩ).

In the illustrated example of FIG. 1, thin film-type shunt resistors (Rtfs1, Rtfs2) can be used when the load current ($I_L$) is in the medium or low range. The thin-film shunt resistors can be thin-film resistor and can have values of tens of ohms to hundreds of kilo-ohms. The thin-film gain resistor (Rtfg) can be used together with the thin-film shunt resistors (Rtfs1, Rtfs2). Thin-film material typically has a higher sheet rho compared to metal and is inexpensive for fabricating resistors having values ranging from 10s of ohms to 100s of kΩ. The operating principle of the current sense circuit 101 is independent of the type of resistor material for the selected shunt and gain resistors. In the illustrated example of FIG. 1, when the thin-film resistors are selected, the quality of the representation ($I_{MON}$) of the load current relies on the ratio Rtfs1/Rtfg or Rtfs2/Rtfg. The switches Sm1-Sm6 and Stf1-Stf9 allow the current monitor to operate at various sense ranges. The selection of which sense range to use could be programmed manually, or automatically via the controller 106 based on the representation ($I_{MON}$) of the load current.

Figure 2:
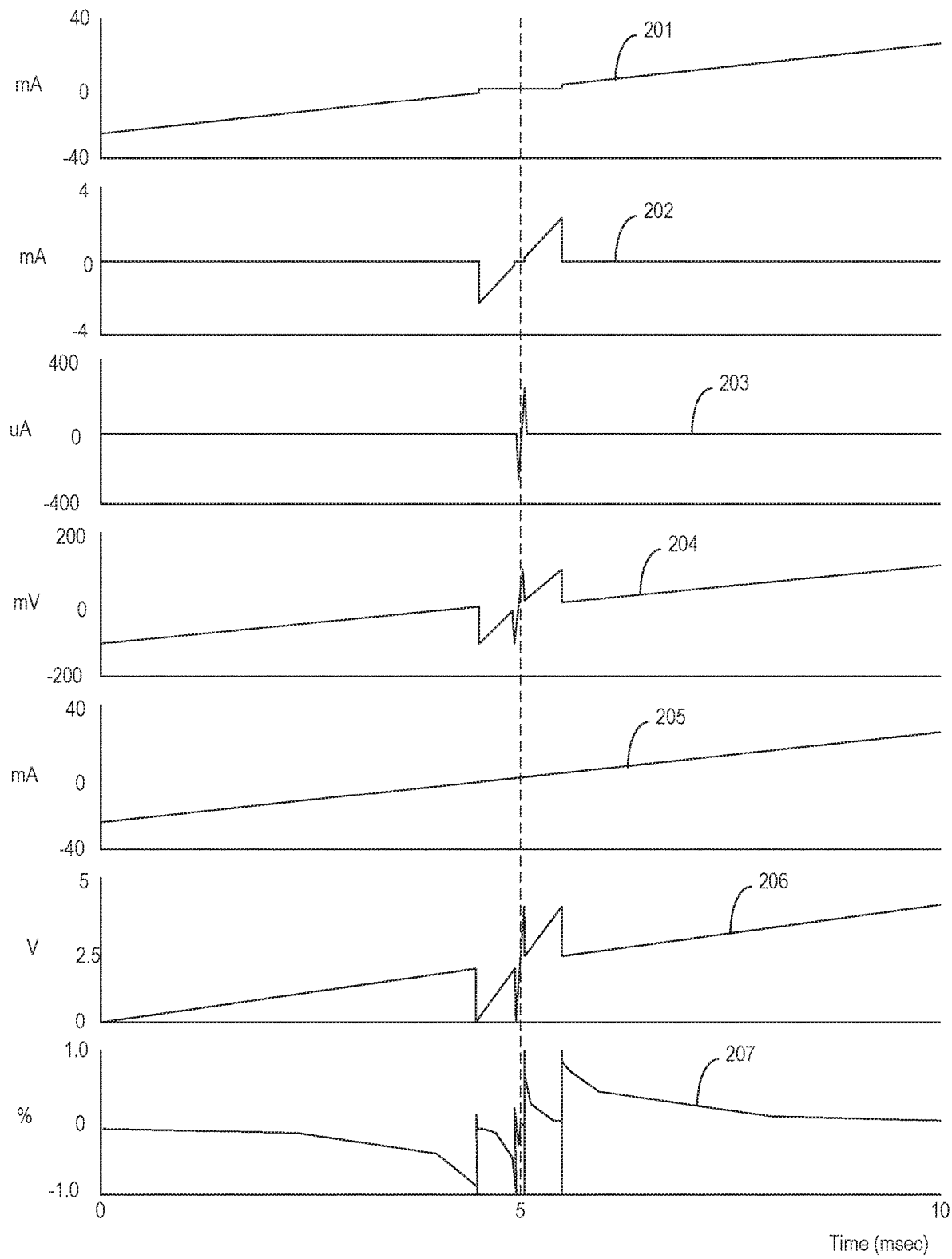
FIG. 2 shows the transient simulation result of the example current sensing circuit of FIG. 1.

FIG. 2 shows the transient simulation result of the example current sensing circuit of FIG. 1. The simulation results include a plot 201 of the current conducted via the metal shunt resistor (Rms), a plot 202 of the current conducted via the first thin-film shunt resistor (Rtfs1), a plot 203 of the current conducted via the second thin-film shunt resistor (Rtfs2), a plot 204 of the voltage difference between the output voltage ($V_{OUT}$) and the load voltage ($V_{LOAD}$), a plot 205 of the load current ($I_L$), a plot 206 of the representation of the load current ($I_{MON}$), and a plot 207 of the error in the representation of the load current ($I_{MON}$). In the simulation setup, the load current is swept from −25 mA to 25 mA. The positive polarity of the load current is defined as a load current flowing from the power supply to the load. The switches Stf2-Stf8 and Sm1-Sm6 change states as the magnitude of the load current passes through the thresholds of ±2.5 mA, ±250 µA, and ±25 µA. The plot 207 at the bottom shows the output error of the current monitor circuit. At time=0s, when the load current is at −25 mA, the shunt resistor Rms is selected to conduct the load current. This puts the current monitoring circuit in the highest current monitoring range. As the simulation time increases, the magnitude of the load current magnitude decreases, and so as the input signal to the current monitor. A smaller input signal means that the output of the current sensor circuit is more susceptible to the input offset errors from A1 and A2.

At time=4.5 ms ($I_L$=−2.5 mA), the switches Stf1 to Stf6 and Sm1 to Sm6 change states to select Rtfs1 as the shunt resistor. At this moment, Rtfs1 and Rtfg are selected. The current sensor's output jumps back to close to negative full-scale the moment after the switches change states. At the instant after the range changed, the input signal level recovers to a reasonable level relative to the full-scale level of the range. Now with Rtfs1 the signal across the selected shunt resistor is larger relative to the offset error of A1's and A2's, and the current monitor's output error becomes smaller.

As the load current continues to decrease in magnitude until at 4.95 ms ($I_L$=−250 µA), the current monitor changes range. Switches Stf1-Stf3 and Stf7-Stf9 change states to select Rtfs2 and Rtfg for current sensing. By selecting Rtfs2 as the shunt resistor, the current sensor is operating at the lowest sense range. At the instant after the range changed, the voltage across "$V_{OUT}$" and "$V_{LOAD}$" becomes large again and the current monitor's output error becomes smaller.

The load current becomes 0 A at time=5 ms and continues to ramp up until it reaches 25 mA at 10 ms. As the load current changes from 0 A to full scale between ms and 10 ms, the current monitor changes its sense range from low to high. As the load current approaches 250 uA at 5.05 ms, Rtfs1 and Rtfg are selected as the shunt and gain resistors. As the load current continues to increase and approaches 2.5 mA at 5.5 ms, Rms and Rmg are selected as the shunt and gain resistors.

Figure 3:
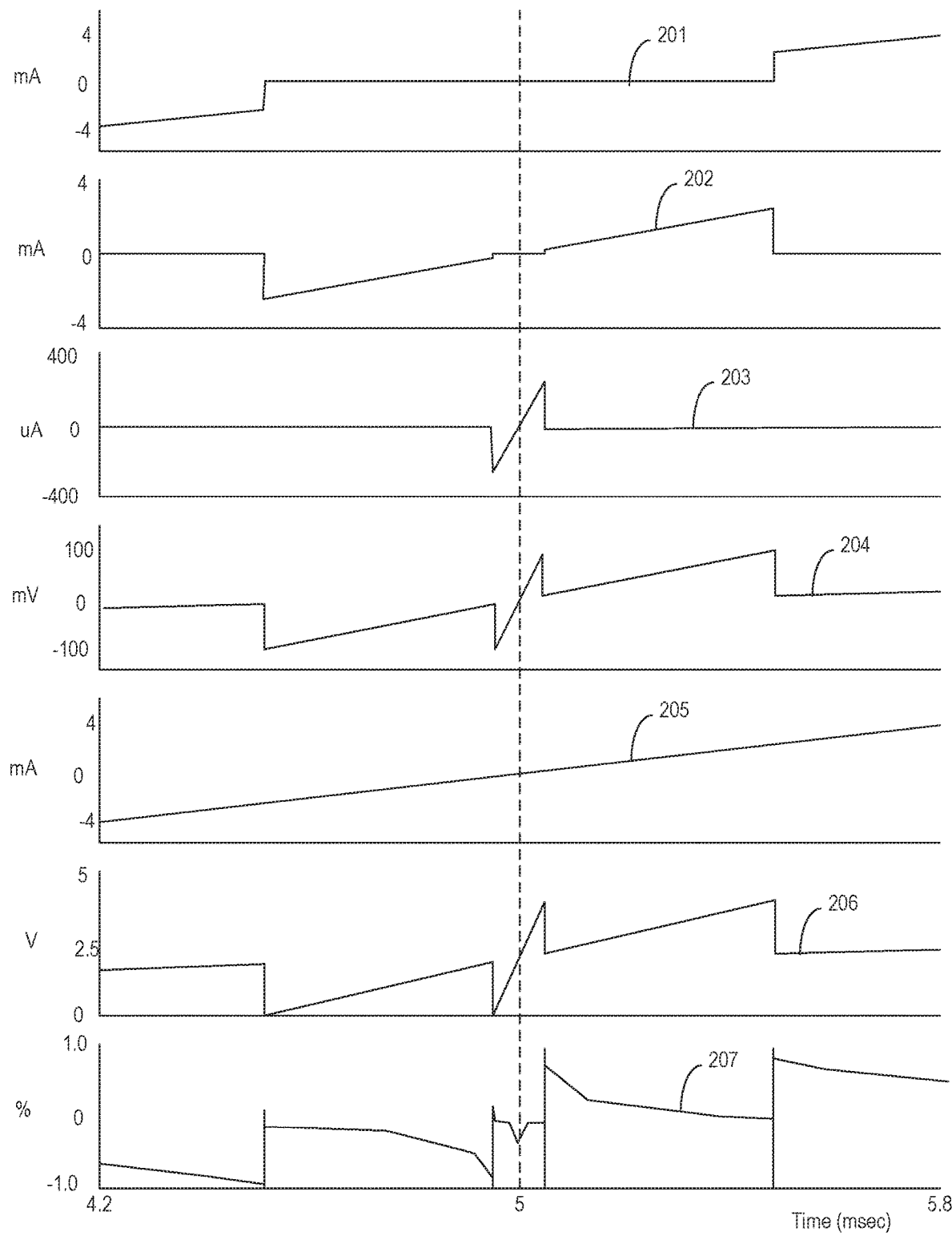
FIG. 3 shows the transient simulation result as shown in FIG. 2 for time between 4.2 ms to 5.8 ms.

FIG. 3 shows the transient simulation result as shown in FIG. 2 for time between 4.2 ms to 5.8 ms, and it provides a clearer picture for the range-changing events at 4.5 ms and at 5.5 ms.

Figure 4:
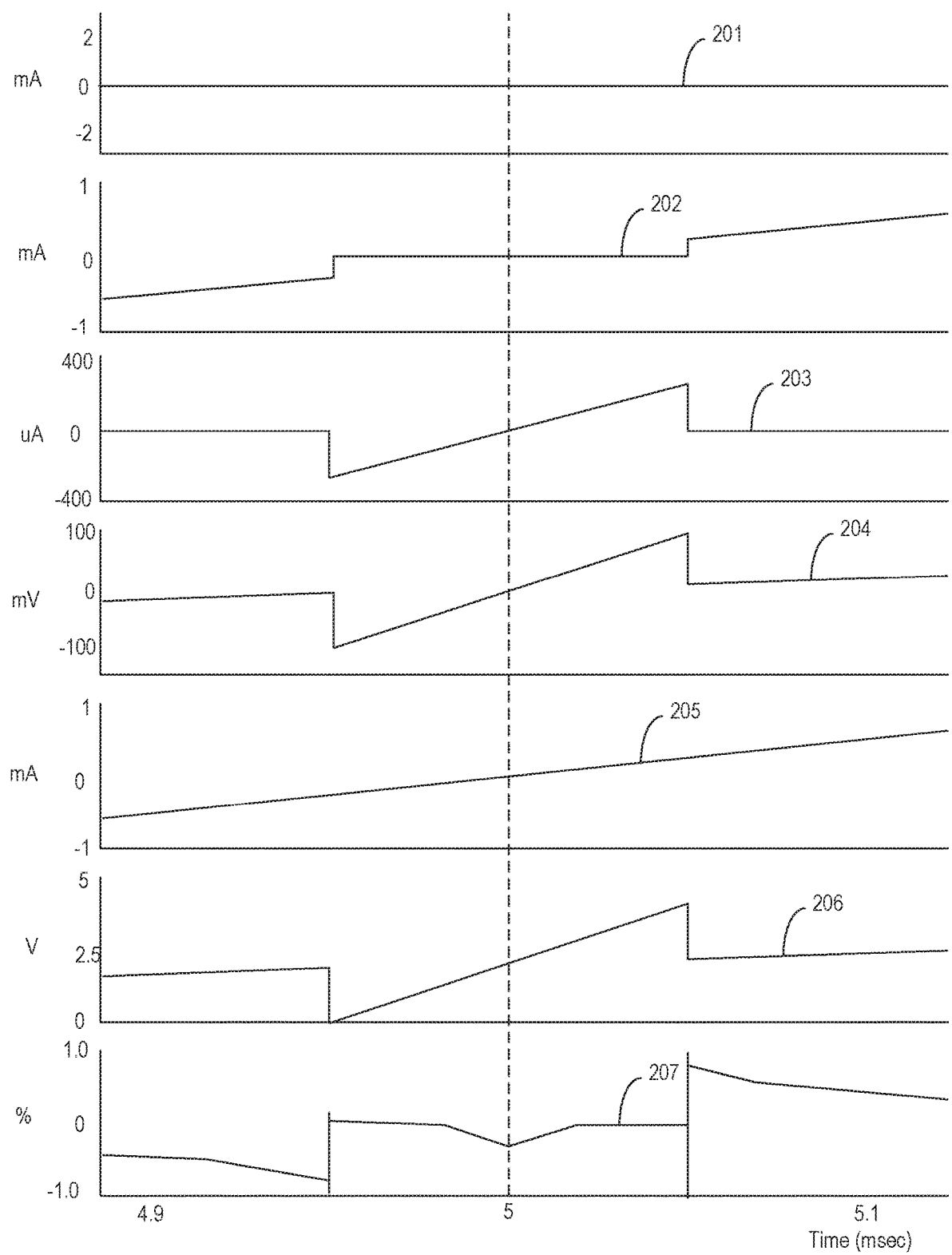
FIG. 4 shows the simulation result between the time 4.9 ms and 5.12 ms.

FIG. 4 shows the simulation result of FIG. 2 between the time 4.9 ms and 5.12 ms, and it provides a clearer picture for the range-changing events at 4.95 ms and at 5.05 ms.

Figure 5:
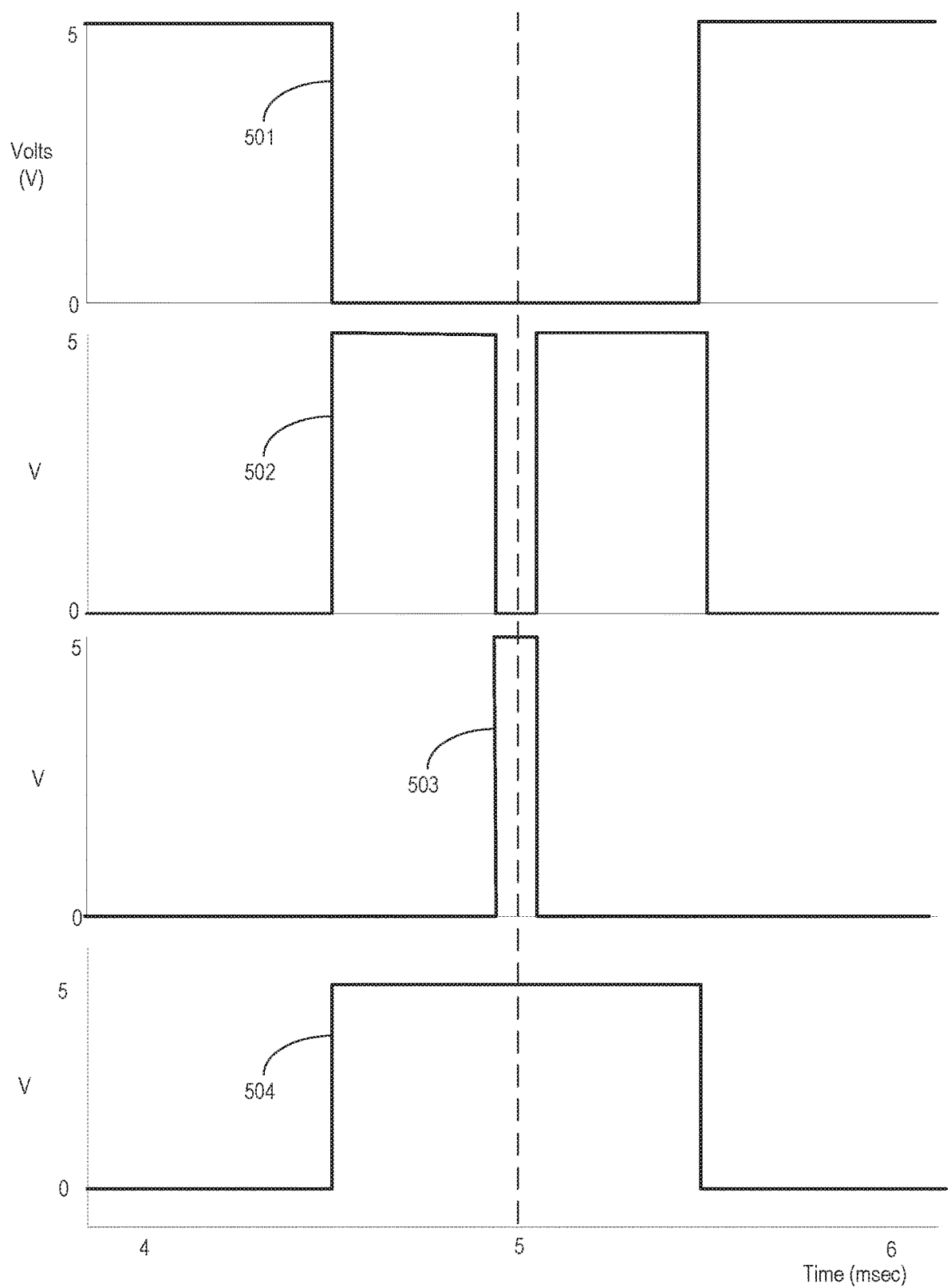
FIG. 5 shows the control signals of switches Sm1-Sm6, and Stf1-Stf9 when the current sensor circuit transitions through various ranges.

FIG. 5 shows the control signals of switches Sm1-Sm6, and Stf1-Stf9 when the current sensor circuit of FIG. 2 transitions through various ranges. FIG. 5 includes a plot 501 of the control signals of switches Sm1-Sm5, a plot 502 of the control signals for Stf1-Stf3, a plot 503 of the control signals for Stf7-Stf9, and a plot of the control signals for Stf4-Stf6. When the current sensor circuit is operating at the highest sense range (time<4.5 ms and >5.5 ms), switches Sm1-Sm6 are in the closed position. When the current sensor circuit is operating at the second highest sense range (4.5 ms<time<4.95 ms and 5.05 ms<time<5.5 ms), switches Stf1-Stf3 and Stf4-Stf6 are in the closed position. When the current sensor circuit is operating at the lowest sense range (4.95 ms<time<5.05 ms), switches Stf7-Stf9 and Stf4-Stf6 are in the closed position.

The design example in FIG. 1 shows a possible arrangement with the gain and shunt resistors made from multiple materials: two shunt resistors and one gain resistor in thin-film; and a gain and a shunt resistor in metal. The proposed architecture does not limit itself to only one gain resistor for each resistor type. A current monitor circuit based on the proposed architecture could include multiple shunt resistors and multiple gain resistors made from a first resistor type, and multiple gain and multiple shunt resistor based on a second resistor type. The idea of using multiple gain and shunt resistors from different resistor material is not limited to using only two resistor types. For example, a current sensor based on the proposed architecture could use thin-film resistor for low current sensing, metal resistor for medium current sensing, and a third resistor type such as discrete resistor for high current sensing.

Figure 6:
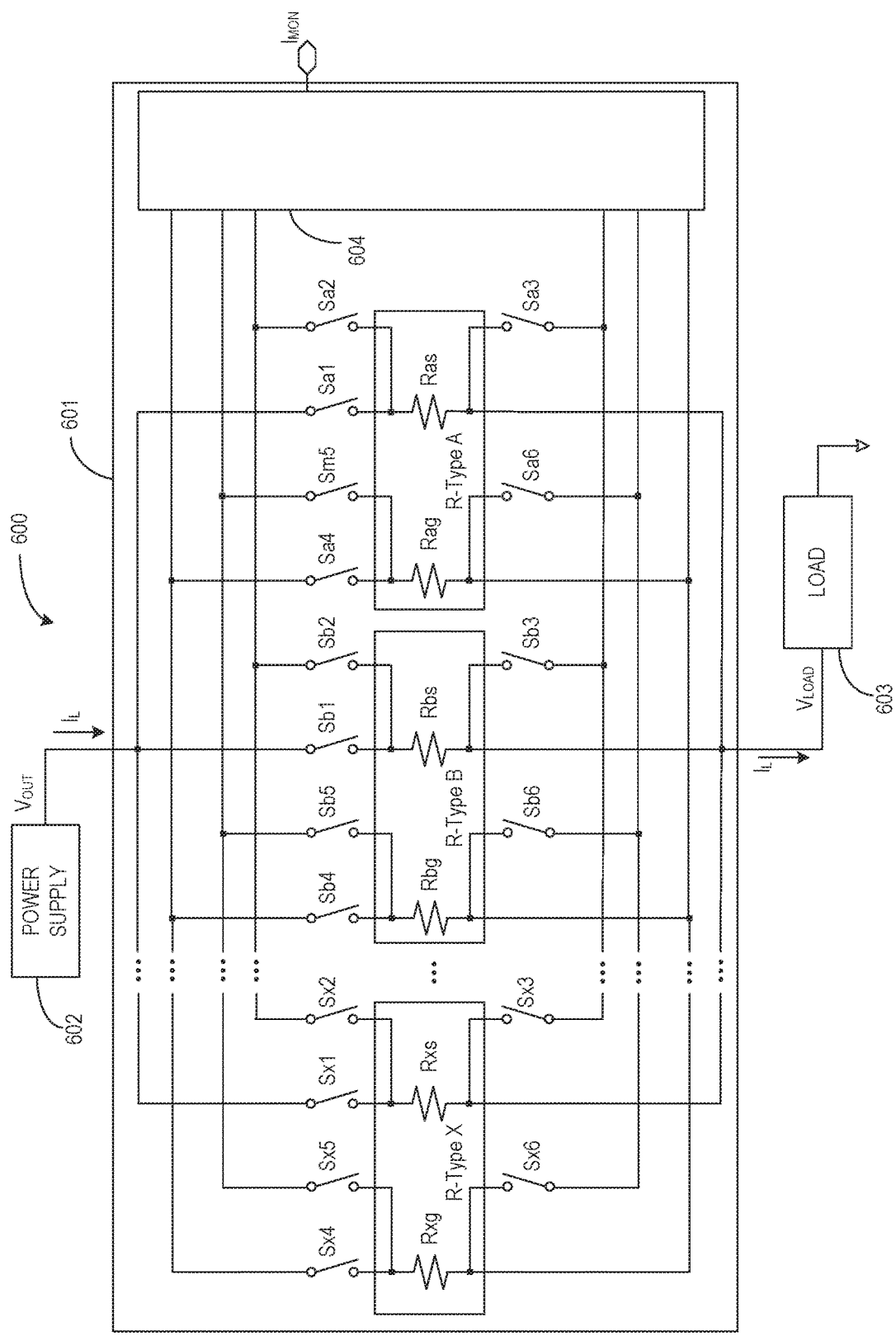
FIG. 6 shows generally an implementation of a system including a general implementation of an example multi-ranging current sensor circuit.

FIG. 6 shows generally an implementation of a system 600 including a general implementation of an example multi-ranging current sensor circuit 601. The system can include the multi-ranging current sensor circuit 601, a power supply 602, and a load 603. The multi-ranging current sensor circuit 601 can include shunt (Ras, Rbs, . . . , Rxs) and gain (Rag, Rbg, . . . , Rxg) resistors made from various resistor types: R-Type A, R-TypeB, . . . , R-TypeX. Conversion circuitry 604 can uses the gain and shunt resistors to produce an output signal ($I_{MON}$) representative of the magnitude and polarity of the load current ($I_L$). When the gain and shunt resistors (Rag and Ras) from the first resistor type are selected, switches Sa1-Sa6 are closed and couple the voltages of both terminals of the selected gain resistor (Rag) and the selected shunt resistor (Ras) to the conversion circuitry 604. Likewise, when the resistors (Rbg Rbs) from the second resistor type are selected, switches Sb1-Sb6 are closed to couple the voltages at both terminals of the selected gain resistor (Rbg) and the selected shunt resistor (Rbs) to the conversion circuitry 604. When the resistors (Rxg, Rxs) from resistor type X are selected, the corresponding switches Sx1-Sx6 are closed to couple top and bottom terminals of the selected gain resistor (Rxg) and the selected shunt resistor (Rxs) to the conversion circuitry 604. The output signal ($I_{MON}$) of the multi-ranging current sensor circuit 601 can be a voltage output, or a current signal.

Figure 7:
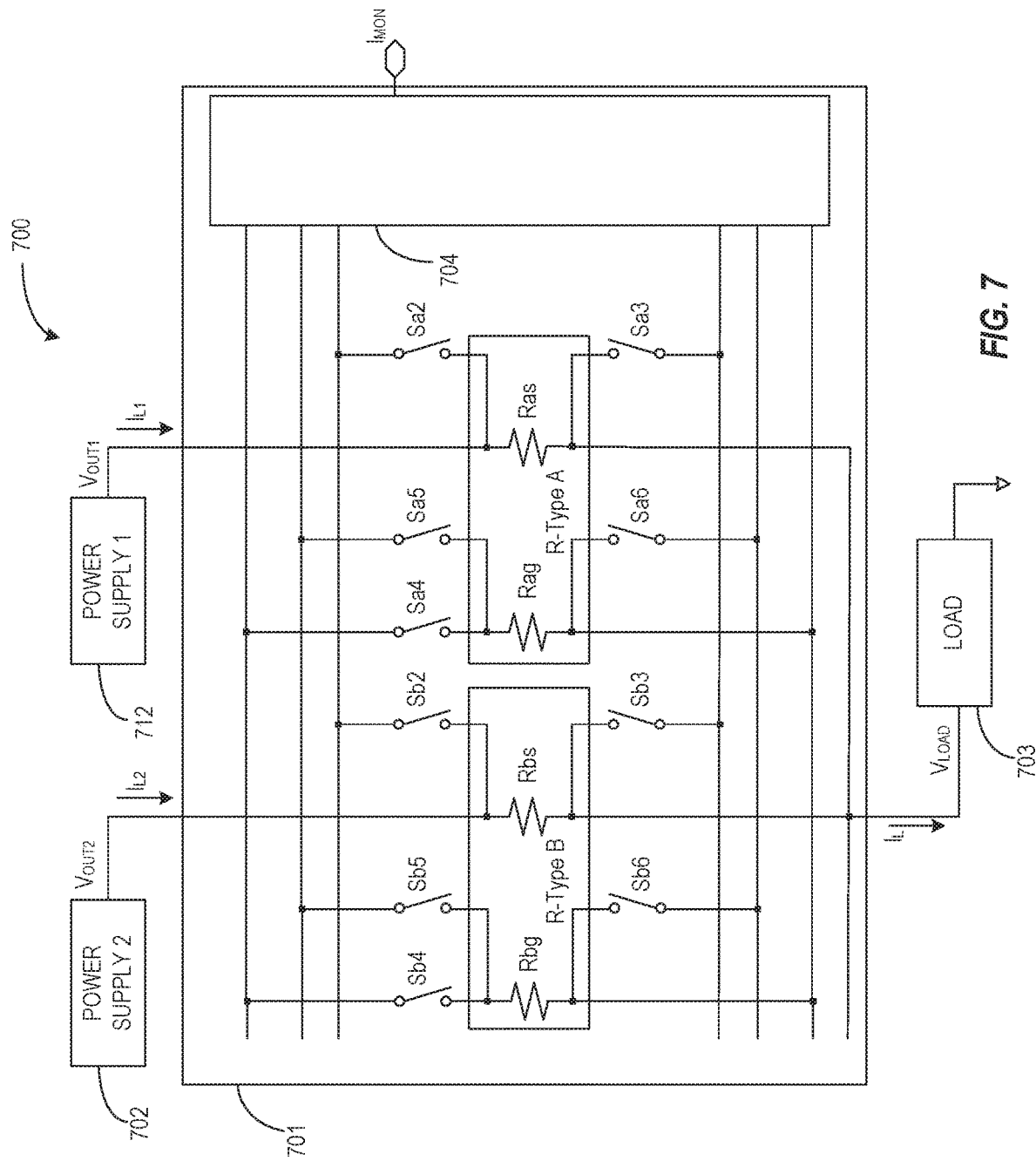
FIG. 7 illustrates generally a system including an example multi-ranging current monitor design with more than one power supply providing the load current.

FIG. 7 illustrates generally a system including an example multi-ranging current monitor design with more than one power supply providing the load current. A first power supply 712 can be a regulator with high current sourcing or sinking capability, and a second power supply 702 can be a regulator with a lower current sinking or sourcing capability compared to the first power supply 712. This arrangement can have certain advantages over the example system 600 of FIG. 6. In high current operation, switching DC-DC convertors can be more efficient than linear regulators, which might have higher power loss, in providing the load current ($I_L$). In such cases, a DC-DC convertor can be used for the first power supply 712 and can drive the load 703 during high current demand. The example system 700 can also reduce the number of switches in series with the shunt resistors (e.g., Rbs, Ras). The shunt resistors (Ras, Rbs), when selected, can directly connect the corresponding power supply with the shunt resistor unlike the example of FIG. 6, where the shunt resistor s (Ras, Rbs, . . . , Rxs) are series with the corresponding switch (e.g., Sa1, Sb1, . . . , Sx1). Eliminating the series switch coupling the shunt resistor with the corresponding power supply can reduce design complexity and cost as the switch that is in series with the shunt resistor in the highest current range can handle the full-scale load current ($I_L$). Referring to FIG. 7, when the load current ($I_L$) is low, the second power supply 702 can provides the load current through the corresponding shunt resistor (Rbs). Switches Sa2-Sa6 are open and Sb2-Sb6 are closed to select the gain resistor (Rbg) and the shunt resistor (Rbs). When—Type B resistors (Rbg, Rbs) are selected, the output signal ($I_{MON}$) of the multi-ranging current monitor 701 can be indicative of the output current ($I_{L2}$) of the second power supply. When the load current ($I_L$) is high, the first power supply 712 can provide the load current ($I_L$) through the corresponding shunt resistor (Ras). Switches Sa2-Sa6 are closed and Sb2-Sb6 are open to select the gain resistor (Rag) and the shunt resistor (Ras). When the R-type A resistors are selected, the output signal ($I_{MON}$) of the multi-ranging current monitor 701 can be indicative of the output current ($I_{L1}$) of the first power supply.

Figure 8:
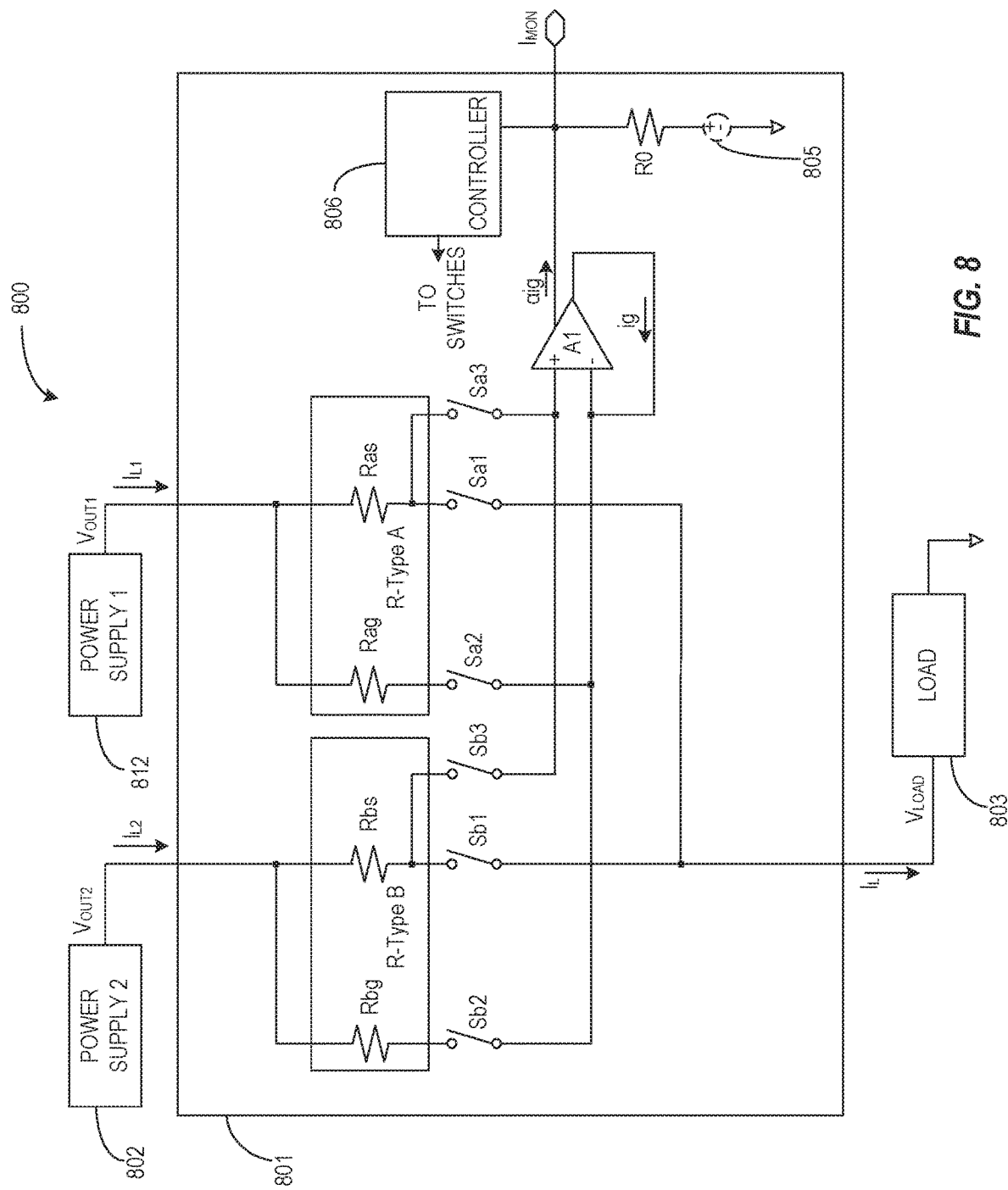
FIG. 8 illustrates generally an alternative example system.

FIG. 8 illustrates generally an alternative example system. The system can be employed with at least one less amplifier than the example system of FIG. 7.

The system can include a first power supply 812, a second power supply 802, a multi-ranging current monitor circuit 801, and a load 803. The multi-ranging current monitor circuit 801 can include shunt resistors (Ras, Rbs), gain resistors (Rag, Rbg), a plurality of switches (Sa1, Sa2, Sa3, Sb1, Sb2, Sb3), an optional output resistor (R0), an optional voltage reference 805, and a controller 806. The controller 806 can monitor the scaled representation (IMON) at the output of the current sense circuit 801 and can control the switches (Sa1, Sa2, Sa3, Sb1, Sb2, Sb3) to accommodate, in most cases, the best sensing range for the level of current sensed. In certain examples, the first power supply 812 can be a regulator with high current sourcing or sinking capability, and the second power supply 802 can be a regulator with a lower current sinking or sourcing capability compared to the first power supply 812. Compared to the circuit of FIG. 7, the multi-ranging current monitor circuit 801 has a single amplifier instead of two amplifiers. When switches Sb1-Sb3 are closed, and the other switches are open, the load current ($I_L$) flow through the shunt resistor (Rbs) on the left. When switches Sa1-Sa3 are closed, and the other switches are open, the load current ($I_L$) flows through the shunt resistor (Ras) on the right. Amplifier A1 can couple a first terminal of the selected shunt resistor (Ras or Rbs) to the first terminal of the selected gain resistor (Rag or Rbg). The second terminals of the selected gain and shunt resistors are coupled physically.

Figure 9:
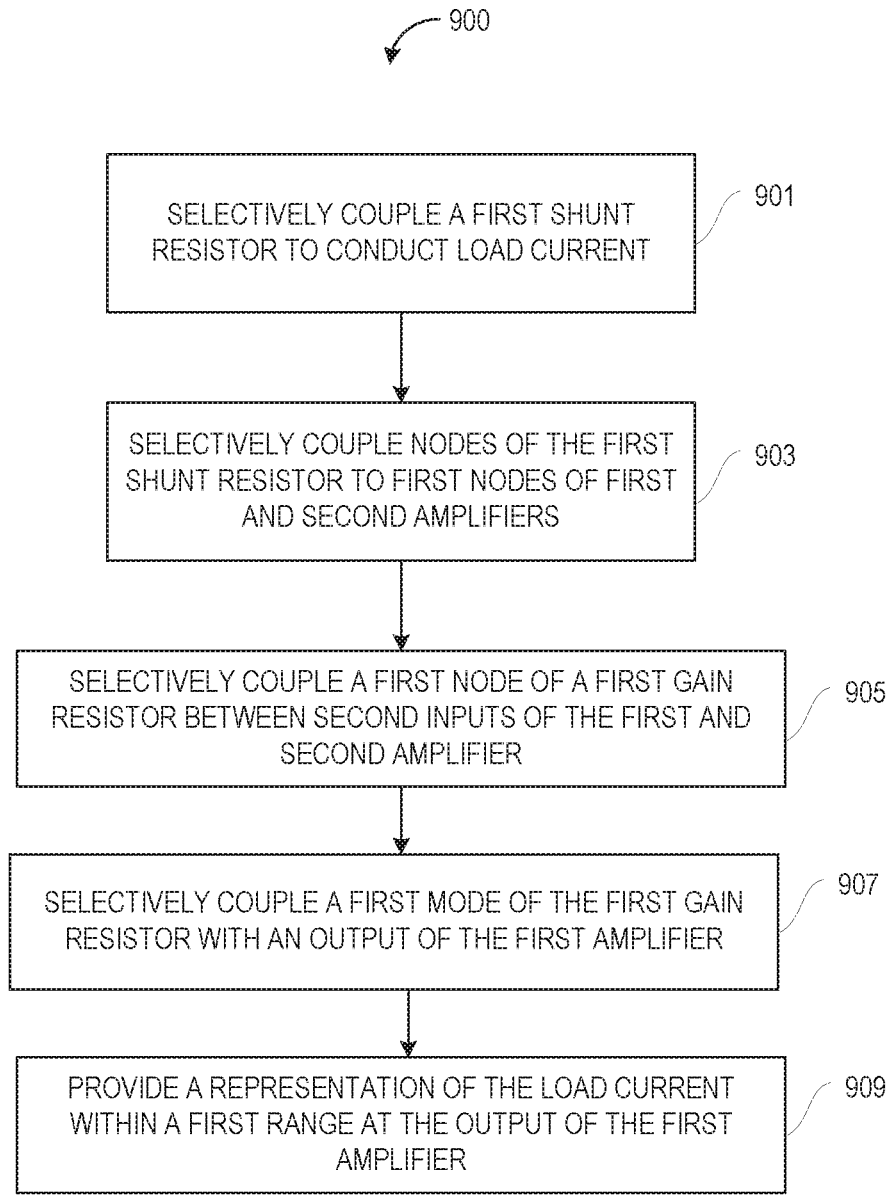
FIG. 9 illustrates generally a flowchart of an example method of operation a multiple-range current sensor according to the present subject matter.

FIG. 9 illustrates generally a flowchart of an example method of operation a multiple-range current sensor according to the present subject matter. At 901, a first shunt resistor can be selectively coupled to conduct a load current. The first shunt resistor can be one of two or more shunt resistors of the multiple range current sensor. At 903, nodes of the selected shunt resistor can be selectively coupled with a first node of a first amplifier and a first node of a second amplifier. At 905, a first gain resistor of a plurality of gain resistors can be selectively coupled between a second input of the first amplifier and a second input of the second amplifier. In certain examples, the selected gain resistor, the first gain resistor, can be of a same structural and material construction as the selected shunt resistor. In certain examples, the selected shunt resistor and the selected gain resistor can be of a different structural and material construction than one or more of the pluralities of other shunt and gain resistors. Such construction can include the same conductive material, the same substrate material, or a combination thereof. At 907, a first node of the selected gain resistor can be selectively coupled with an output of the first amplifier. In certain examples, a signal at the second node of the selected gain resistor can be processed as a feedback signal of the second amplifier. At 909, a representation of the load current within a first range can be provided at the output of the first amplifier. A representation of the load current within a second range can be provided by selecting and replacing the first shunt resistor, and possibly the first gain resistor, with different resistors of the pluralities of shunt and gain resistors, as long as the selected shunt and gain resistors are of the same type as discussed above.

NOTES AND EXAMPLES

In a first example, Example 1, a circuit to provide a representation of a load current can include a plurality of shunt resistors, wherein a first shunt resistor of the plurality of shunt resistors is of a different type and resistance that the other shunt resistors of the plurality of shunt resistors, and wherein each shunt resistor of the plurality of shunt resistors is configured to selectively conduct the load current, a plurality of gain resistors including a first gain resistor of the same resistor type as the first shunt resistor, wherein the first gain resistor is a different resistor type than the other gain resistors of the plurality of gain resistors, and a first switch configured to couple the first shunt resistor with the load in a first state and to isolate the first shunt resistor from the load in a second state.

In Example 2, the plurality of shunt resistors of Example 1 optionally includes more than two individually selectable shunt resistors.

In Example 3, optionally, an integrated circuit can include at least two of the plurality of shunt resistors of any one or more of Examples 1-2.

In Example 4, the integrated circuit of any one or more of Examples 1-3 optionally includes an amplifier selectively coupled to the first gain resistor.

In Example 5, the integrated circuit of any one or more of Examples 1-4 optionally includes a controller configured to control the first switch.

In Example 6, a first shunt resistor of the plurality of shunt resistors of any one or more of Examples 1-2 optionally includes a laminate substrate.

In Example 7, the laminate substrate of any one or more of Examples 1-6 optionally is a Bismaleimide-Triazine resin (BT)-substrate.

In Example 8, the circuit of any one or more of Examples 1-7 optionally includes a plurality of switches configured to configure the circuit for a first current sensing range of a plurality of current sensing ranges, wherein the plurality of switches includes the first switch.

In Example 9, a method of operating a multiple range current sense circuit can include selectively coupling a first shunt resistor of a plurality of shunt resistors to conduct a load current, selectively coupling a node of the first shunt resistor with a first node of a first amplifier, selectively coupling a first gain resistor of a plurality of gain resistors with a second input of the first amplifier, selectively coupling a first node of the first gain resistor with an output of the first amplifier, providing a representation of the load current over a first range at the output of the first amplifier, and wherein the first shunt resistor and the first gain resistor include conductive media of the same material.

In Example 10, the first shunt resistor and the first gain resistor of any one or more of Examples 1-9 optionally include the same substrate material.

In Example 11, the method of any one or more of Examples 1-10 optionally includes sensing the representation the load current approaching an extreme of the first range.

In Example 12, the method of any one or more of Examples 1-11 optionally includes isolating the first shunt resistor from conducting the load current and from the first amplifier in response to the sensing the representation the load current approaching the extreme of the first range, selectively isolating the first gain resistor from the first amplifier in response to the sensing the representation the load current approaching the extreme of the first range, and selectively coupling a second shunt resistor to conduct the load current and a second gain resistor with the amplifier to sense the load and provide an indication of the load current over a second range.

In Example 13, the second range of any one or more of Examples 1-12 optionally is higher than the first range.

In Example 14, the selectively coupling a node of the first shunt resistor of any one or more of Examples 1-13 optionally includes selectively coupling a node of the first shunt resistor with a first node of a first amplifier and with a first node of a second amplifier, and the selectively coupling a first gain resistor of a plurality of gain resistors of any one or more of Examples 1-13 optionally includes selectively coupling a first gain resistor of a plurality of gain resistors between a second input of the first amplifier and a second input of the second amplifier.

In Example 15, a multiple-range current sense circuit can include multiple means for shunting a load current, means for providing a representation of the load current, and multiple means for providing a gain to the means for providing the representation of the load current.

In Example 16, a conductive material of a first means of the multiple means for shunting the load current and conductive material of a first means for providing a gain of any one or more of Examples 1-15 optionally are a first material.

In Example 17, a conductive material of a second means of the multiple means for shunting the load current and conductive material of a second means for providing a gain of any one or more of Examples 1-16 optionally are a second material.

In Example 18, a substrate material of the first means of the multiple means for shunting the load current and a substrate material of the first means for providing a gain of any one or more of Examples 1-17 optionally are a first substrate material.

In Example 19, a substrate material of the second means of the multiple means for shunting the load current and a substrate material of the second means for providing a gain of any one or more of Examples 1-18 optionally are a second substrate material.

In Example 20, the multiple means for shunting the load current, the means for providing the representation of the load current, and the multiple means for providing a gain of any one or more of Examples 1-19 optionally are configured to provide the representation using at least three ranges of resolution.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A circuit configured to provide a representation of a load current, the circuit comprising:
    a plurality of shunt resistors, wherein a first shunt resistor of the plurality of shunt resistors is of a different type and resistance than the other shunt resistors of the plurality of shunt resistors, and wherein each shunt resistor of the plurality of shunt resistors is configured to selectively conduct the load current;
    a plurality of gain resistors including a first gain resistor of the same resistor type as the first shunt resistor, wherein the first gain resistor is a different resistor type than the other gain resistors of the plurality of gain resistors; and
    a first switch configured to couple the first shunt resistor with the load in a first state and to isolate the first shunt resistor from the load in a second state.

2. The circuit of claim 1, wherein the plurality of shunt resistors includes more than two individually selectable shunt resistors.

3. The circuit of claim 1, wherein an integrated circuit includes at least two of the plurality of shunt resistors.

4. The circuit of claim 3, wherein the integrated circuit includes an amplifier selectively coupled to the first gain resistor.

5. The circuit of claim 4, wherein the integrated circuit includes a controller configured to control the first switch.

6. The circuit of claim 1, wherein a first shunt resistor of the plurality of shunt resistors includes a laminate substrate.

7. The circuit of claim 6, wherein the laminate substrate is a Bismaleimide-Triazine resin (BT)-substrate.

8. The circuit of claim 1, including a plurality of switches configured to configure the circuit for a first current sensing range of a plurality of current sensing ranges, wherein the plurality of switches includes the first switch.

9. A method of operating a multiple range current sense circuit, the method comprising:
    selectively coupling a first shunt resistor of a plurality of shunt resistors to conduct a load current;
    selectively coupling a node of the first shunt resistor with a first node of a first amplifier;
    selectively coupling a first gain resistor of a plurality of gain resistors with a second input of the first amplifier;
    selectively coupling a first node of the first gain resistor with an output of the first amplifier;
    providing a representation of the load current over a first range at the output of the first amplifier; and
    wherein the first shunt resistor and the first gain resistor include conductive media of the same material.

10. The method of claim 9, wherein the first shunt resistor and the first gain resistor include the same substrate material.

11. The method of claim 9, including sensing the representation the load current approaching an extreme of the first range.

12. The method of claim 11, including isolating the first shunt resistor from conducting the load current and from the first amplifier in response to the sensing the representation the load current approaching the extreme of the first range;
    selectively isolating the first gain resistor from the first amplifier in response to the sensing the representation the load current approaching the extreme of the first range; and
    selectively coupling a second shunt resistor to conduct the load current and a second gain resistor with the first amplifier to sense the load and provide an indication of the load current over a second range.

13. The method of claim 12, wherein the second range is higher than the first range.

14. The method of claim 9, wherein:
    selectively coupling a node of the first shunt resistor includes selectively coupling a node of the first shunt resistor with a first node of a first amplifier and with a first node of a second amplifier; and
    selectively coupling a first gain resistor of a plurality of gain resistors includes selectively coupling a first gain resistor of a plurality of gain resistors between a second input of the first amplifier and a second input of the second amplifier.

15. A load current monitoring system comprising:
    a plurality of shunt devices, wherein a first shunt device of the plurality of shunt devices comprises a first material type, and wherein a second shunt device of the plurality of shunt devices comprises a different second material type, and wherein each shunt device of the plurality of shunt devices is configured to selectively conduct a load current for a circuit load;

a plurality of gain devices, wherein a first gain device of the plurality of gain devices comprises the first material type and a second gain device of the plurality of gain devices comprises the second material type; and a switch controller configured to monitor a scaled representation of the load current and, in response, control a switch to selectively couple one or the other of the first and second shunt devices to the circuit load to change a range of the scaled representation of the load current.

16. The load current monitoring system of claim 15, wherein the switch controller is configured to control the switch to change a resolution of the scaled representation of the load current.

17. The load current monitoring system of claim 15, wherein the first shunt device and the first gain device comprise respective resistors having the first material type, and wherein the second shunt device and the second gain device comprise respective resistors having the second material type.

18. The load current monitoring system of claim 15, wherein the first material type comprises a first substrate material and the second material type comprises a different second substrate material.

19. The load current monitoring system of claim 18, wherein the first material type further comprises a first conductive material and the second material type further comprises a different second conductive material.

20. The load current monitoring system of claim 15, further comprising first and second switches associated with the first and second shunt devices, respectively, and third and fourth switches associated with the first and second gain devices, respectively;

wherein the switch controller is configured to selectively actuate the first and third switches together, and to selectively actuate the second and fourth switches together, to thereby control signals flowing to the load circuit and to an output amplifier circuit, wherein the output amplifier circuit is configured to provide the scaled representation of the load current.

* * * * *